United States Patent
Matsuki et al.

[11] Patent Number: 5,976,946
[45] Date of Patent: Nov. 2, 1999

[54] THIN FILM FORMATION METHOD FOR FERROELECTRIC MATERIALS

[75] Inventors: Takeo Matsuki; Yoshihiro Hayashi, both of Tokyo, Japan

[73] Assignee: NEC Corporation, Tokyo, Japan

[21] Appl. No.: 08/869,444

[22] Filed: Jun. 5, 1997

[30] Foreign Application Priority Data

Jun. 19, 1996 [JP] Japan ................................. 8-158562

[51] Int. Cl.$^6$ ................................................ H01L 21/385
[52] U.S. Cl. ........................ 438/393; 438/763; 438/981
[58] Field of Search ................................. 438/393, 396, 438/763, 981; 117/92; 257/295, 296, 303, 306, 310

[56] References Cited

U.S. PATENT DOCUMENTS

| | | | |
|---|---|---|---|
| 3,998,980 | 12/1976 | Antes et al. | 427/103 |
| 4,222,814 | 9/1980 | Reitz | 156/612 |
| 5,242,707 | 9/1993 | Esener et al. | 427/126.3 |
| 5,337,207 | 8/1994 | Jones et al. | 361/321.1 |
| 5,344,796 | 9/1994 | Shin et al. | 437/233 |
| 5,434,102 | 7/1995 | Watanabe et al. | . |
| 5,587,343 | 12/1996 | Kano et al. | 437/228 |
| 5,757,061 | 5/1998 | Satoh et al. | . |
| 5,834,803 | 11/1998 | Nashimoto | . |

FOREIGN PATENT DOCUMENTS

| | | | |
|---|---|---|---|
| 0495994 | 8/1991 | European Pat. Off. | H01L 27/115 |
| 0688015 | 6/1995 | European Pat. Off. | G11B 7/00 |
| 0755070 | 1/1997 | European Pat. Off. | H01L 29/92 |
| 4-206871 | 7/1992 | Japan | H01L 27/112 |
| 5-63205 | 3/1993 | Japan | H01L 29/788 |
| 6-21337 | 1/1994 | Japan | H01L 27/04 |
| 657411 | 3/1994 | Japan | C23C 14/08 |
| 6-132496 | 5/1994 | Japan | H01L 27/108 |
| 7-183397 | 7/1995 | Japan | H01L 21/8242 |
| 8-8407 | 1/1996 | Japan | H01L 27/10 |
| 10-56142 | 2/1998 | Japan | H01L 27/10 |
| 2199593 | 7/1988 | United Kingdom | C23C 14/46 |
| 2213839 | 8/1989 | United Kingdom | C23C 14/06 |
| 9502897 | 1/1995 | WIPO | H01L 21/316 |

OTHER PUBLICATIONS

"Effect of Thermal Processing Conditions on Ferroelectric PZT Thin Films" Kwok et al Mat. Res. Soc. Symp. Proc. vol. 200; 1990; pp. 83–89.

*Primary Examiner*—Charles Bowers
*Assistant Examiner*—Keith Christianson
*Attorney, Agent, or Firm*—Hayes, Soloway, Hennessey, Grossman & Hage PC

[57] ABSTRACT

A thin film formation method includes the deposition step of forming a dielectric thin film consisting of many elements. In the deposition step, first- and second-layer thin films are deposited as lower and upper layers on an underlayer, and at least one of the thin films is crystallized to form the dielectric thin film. The first-layer thin film closer to the underlayer is deposited with a larger composition of at least one kind of constituent element of the thin film than stoichiometric composition to allow for diffusion outside the film.

15 Claims, 7 Drawing Sheets

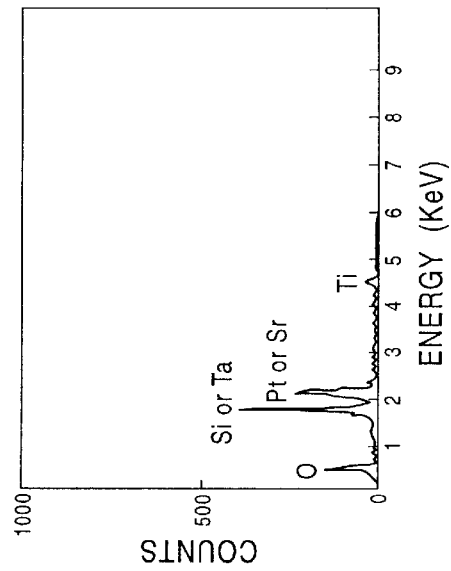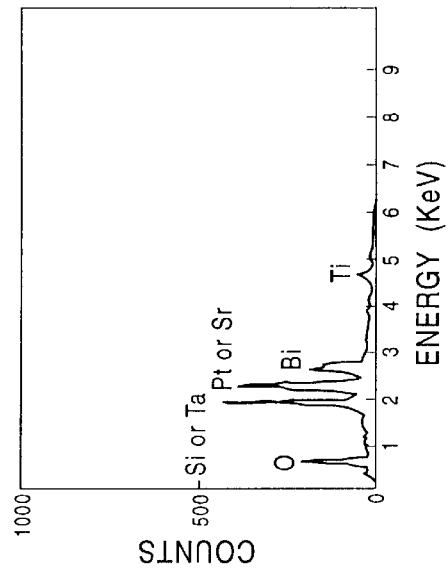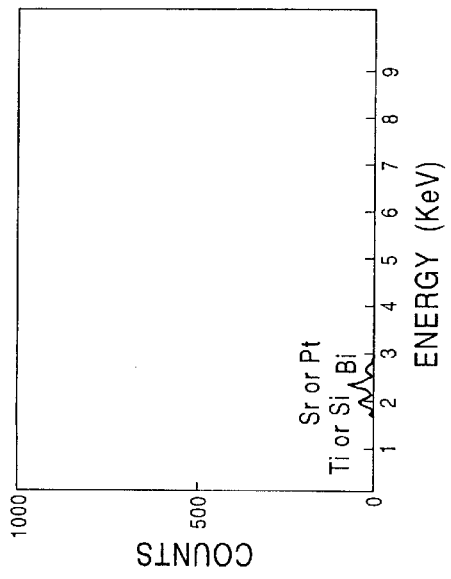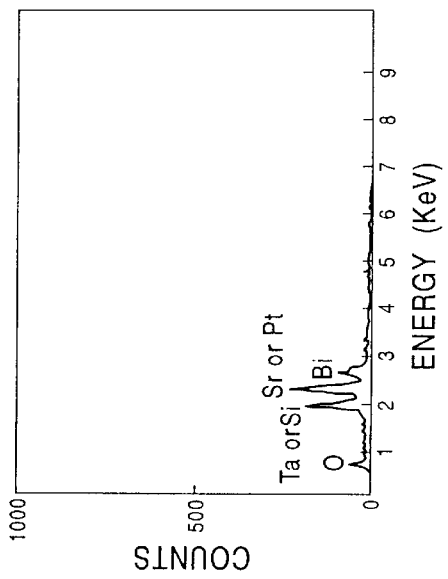
FIG. 3A PRIOR ART
FIG. 3B PRIOR ART
FIG. 3C PRIOR ART
FIG. 3D PRIOR ART

THIN FILM FORMATION METHOD FOR FERROELECTRIC MATERIALS

BACKGROUND OF THE INVENTION

1. Field of the Invention

The present invention relates to a method of manufacturing a semiconductor device and, more particularly, to a method of manufacturing a thin film used for an electronic component, a semiconductor integrated circuit, and the like.

2. Description of the Prior Art

At present, thin film formation techniques are indispensable to techniques of manufacturing electronic components and, particularly, semiconductor integrated circuits.

These techniques are more important for memory elements or memory integrated circuits using ferroelectrics or high dielectrics as a capacitor film material.

In a conventional Si-LSI process, a single-crystal Si substrate is used as a substrate. An Si oxide film and an Si nitride film are formed as ferroelectric films on the substrate, and a poly-Si film is stacked as an electrode film. These film formation techniques realize precise film thickness control and high-speed deposition.

At present, deposition techniques such as CVD and sputtering used in the Si-LSI process have been developed for ferroelectric and high-dielectric thin films which receive a great deal of attention as new capacitor dielectric films. Well-known solid materials exhibiting ferroelectric properties are composite metal compounds having a perovskite crystal structure and a layered perovskite crystal structure. As the composite metal compound having the perovskite crystal structure, lead zirconate titanate (PZT), $BaTiO_3$, $SrTiO_3$, and the like are known. As the composite metal compound having the layered perovskite crystal structure, $SrBi_2Ta_2O_9$, $PbBi_2Ta_2O_9$, and the like are known.

Many examples employing the above-described CVD and sputtering, and the sol-gel method as the deposition method have been reported. One example is disclosed in Japanese Unexamined Patent Publication No. 6-57411, and its technique will be described with reference to FIG. 1.

As shown in FIG. 1, a conductive film 123 is formed on a substrate 121 directly or through a buffer layer 122. A dielectric underlayer 124 is formed on the conductive film 123, and a perovskite oxide dielectric thin film 125 is formed on the dielectric underlayer 124. A metal film formed on the thin film 125 is processed to form an upper electrode 126.

C. K. Kwock et al. deposited a PZT thin film on a Pt underlayer by RF sputtering at a substrate temperature of about 200° C. (Material. Research Society Symposium Proceed ings vol. 200. 1990. p. 83). After the PZT thin film was sputter-deposited on the Pt underlayer heated to a certain temperature, the resultant structure was annealed in a furnace to obtain perovskite crystals. In this case, it was reported that lead diffused outward from the film in high-temperature annealing, and the percent in lead loss from the film was proportional to the annealing temperature (see FIG. 2).

The present inventors also confirmed by experiments that constituent elements diffused into an underlayer even when $SrBi_2Ta_2O_9$ (to be referred to as SBTO hereinafter) which has been receiving a great deal of consideration as a dielectric film material for a ferroelectric memory, was deposited. FIGS. 3A to 3D show the results of energy spectral analyses by energy dispersive X-ray spectroscopy (EDX) when an SBTO film was formed on a Pt/Ti film by magnetron RF sputtering without heating a substrate, and the resultant structure was annealed in oxygen at 800° C.

In this case, the deposition film thickness was about 200 nm. The deposition underlayer was constituted such that a 500-nm thick Si oxide film was formed on an Si substrate, and a 20-nm thick Ti film and a 200-nm thick Pt film were formed on this Si oxide film.

Analyses were performed for an annealed structure and a structure not subjected to annealing. Analyzed portions were two portions, i.e., the SBTO film and underlayer (metal film) of each structure.

In deposition, no peak representing the presence of Bi element contained in the SBTO film was observed in the underlayer (metal film), as shown in FIG. 3B.

After annealing at 800° C., the peak of the Bi element contained in the SBTO film appeared in the underlayer (metal film), as shown in FIG. 3D, which represented that the Bi element diffused from the SBTO film to the underlayer upon annealing.

In a film structure shown in FIG. 3A, a film immediately after deposition without heating a substrate consisted of crystals including many amorphous crystals or defects, so it did not exhibit ferroelectric properties or its properties were very poor. In FIG. 3C, crystallization was sufficiently performed upon heating to obtain desired ferroelectric properties. Therefore, the annealing process is necessary.

However, constituent elements contained in the dielectric thin film also diffuse during crystallization. Atoms which do not contribute to the crystal growth are precipitated in the film or diffuse outside it. "Elements which do not contribute to the crystal growth" means both "elements excessive in constituting crystals" and "elements which diffuse before being entrapped in crystals". When an SBTO film is used as a dielectric thin film on a Pt/Ti underlayer, it is observed that Bi greatly diffuses to the underlayer.

FIG. 4 shows an example of measuring ferroelectric properties obtained when an SBTO film is sputter-deposited on a Pt/Ti underlayer on an Si oxide film and annealed in the oxygen atmosphere at 800° C., and then an upper Pt electrode is arranged to form a capacitor structure. The composition ratios of Bi to Sr before and after annealing which are examined by the ICP (Induced Coupled Plasma) analysis are 2.1 and 2.0, respectively, which are almost stoichiometric composition ratios.

The polarization characteristics, however, are almost 10% the reported value (2Pt=15 to 20 $\mu C/cm^2$), and are not preferable. This is because many Bi components diffuse at the interface region with the underlayer before being entrapped in crystals in crystal growth, resulting in Bi loss at the interface with the underlayer, or because Bi necessary for crystallization decreases upon diffusion of Bi to the underlayer, resulting in a condition with many defects or a region in a condition wherein a desired crystal structure does not satisfactorily grow.

As described above, in the method of depositing a composite metal oxide as a dielectric thin film, when the film is deposited without heating a substrate to a high temperature, the constituent elements of the dielectric thin film diffuse outward or into an underlayer. As a result, the composition ratio of the elements of the dielectric thin film crystallized by annealing undesirably changes. In particular, the distribution at the interface between the surface region of the film and the underlayer is disadvantageously greatly influenced.

When the film is deposited while heating the substrate, if an element having a high vapor pressure is contained as a constituent element in film formation, a crystalline thin film is difficult to grow, while ensuring the stoichiometric composition ratio. Especially, the composition disadvantageously shifts at the interface region with the underlayer. In addition, the constituent elements of crystals are lost to interfere with the film growth. Even if a dielectric thin film serving as a buffer layer and having dielectric properties and the like which hardly influence target properties is deposited as an intermediate layer on an underlayer on which the dielectric thin film having necessary properties should be deposited, the film quality is degraded during deposition unless the respective deposition temperatures are properly controlled.

In Japanese Unexamined Patent Publication No. 6-57411 shown in FIG. 1, as the dielectric underlayer 124 of the perovskite dielectric thin film 125 consisting of $ABO_3$ (A and B are perovskite crystals at A and B sites as atom positions generally designated), a dielectric thin film consisting of $A'BO_3$ or $B'O_3$ using the same constituent elements is effective.

If this underlayer is formed of a dielectric, the composition ratio of the elements of the formed film must exhibit dielectric properties. That is, when a dielectric layer is formed on the dielectric underlayer 124 so as to contact the dielectric underlayer 124 deposited with a precise composition as a dielectric, if the formation temperature is high, or if energy to promote generation of point defects is applied to promote diffusion of elements, diffusion of the elements of the underlayer to the lower conductive film 123 (lower electrode) is difficult to suppress, resulting in poor film properties.

In Japanese Unexamined Patent Publication No. 6-57411, the buffer layer 122 is arranged between the conductive film 123 and the substrate 121 to prevent mutual diffusion between the substrate and the dielectric film. Even with this arrangement, diffusion of the elements of the dielectric layer to the conductive film 123 is difficult to prevent.

SUMMARY OF THE INVENTION

The present invention has been made in consideration of above-described situation in the prior art, and has as its object to provide a thin film formation method in which, even if the constituent elements of a dielectric thin film diffuse outside the film, the loss of constituent elements of the dielectric thin film is prevented at the interface region between the dielectric thin film and an underlayer.

To achieve the above object, according to the first basic aspect of the present invention, there is provided a thin film formation method comprising a deposition step of forming a dielectric thin film consisting of many elements, wherein the deposition step is a process of depositing first- and second-layer thin films as upper and lower layers on an underlayer, and then crystallizing the thin films to form the dielectric thin film, and the first-layer thin film closer to the underlayer is deposited with a larger composition of at least one kind of constituent element of the thin film than stoichiometric composition in consideration of diffusion outside the film.

In the first basic aspect, crystallization by annealing is performed after depositing the first- or second-layer thin films.

In the first basic aspect, crystallization by annealing may be performed while depositing the first- or second-layer thin films.

In the first basic aspect, at least one of the first- or second-layer thin films can be formed by sputtering.

To achieve the above object, according to the second basic aspect of the present invention, there is provided a thin film formation method comprising a first-layer thin film deposition step, a first-layer thin film crystallization step, and a second-layer thin film deposition step, wherein the first-layer thin film deposition step is a process of supplying raw material particles serving as film formation nuclei onto an underlayer, and growing the raw material particles to form the first-layer thin film, the crystallization step is a process of crystallizing the first-layer thin film by annealing, and the second-layer thin film deposition step is a process of forming the second-layer thin film on the first-layer thin film by using one of raw material particles serving as film formation nuclei and a thin film layer, while heating the underlayer and the crystallized first-layer thin film.

In the second basic aspect, annealing in the crystallization step performed after depositing the first-layer thin film is performed at a temperature set higher than a film deposition temperature of the first- or second-layer thin film.

In the first basic aspect, when the dielectric thin film is constituted by an $SrBi_2Ta_2O_9$ film, the constituent element in the first-layer thin film having the composition larger than stoichiometric composition in consideration of diffusion outside the film is Bi.

In the first and second basic aspects, the first-layer thin film is deposited using a gas mixture of argon and oxygen as a plasma reaction gas, and the second-layer thin film is sputter-deposited using only argon as a plasma reaction gas.

In the first and second basic aspects, the second-layer thin film is deposited at a deposition temperature set higher than a deposition temperature of the first-layer thin film.

In the first and second basic aspects, the first-layer thin film is deposited using a gas mixture of argon and oxygen as a plasma reaction gas, and the second-layer thin film is deposited using a gas mixture of argon and oxygen as a plasma reaction gas at a deposition temperature set higher than a deposition temperature of the first-layer thin film.

According to the above-described thin film formation method of the present invention, a first-layer thin film having a higher composition ratio of at least one kind of element constituting a dielectric thin film to be deposited is arranged. Even if the constituent elements of the film diffuse outside the film (including an underlayer), the composition of elements contained in the formed dielectric thin film is kept at the interface with the underlayer, thereby obtaining desired dielectric properties. Especially, an improvement in polarization characteristics, a reduction in leakage current, an increase in service life against a larger number of times of signal application can be expected.

Since the dielectric thin film is deposited by sputtering, the deposition can be performed at a film deposition temperature set lower than the crystallization temperature, and the element composition can be controlled.

The above and many other objects, features and advantages of the present invention will become manifest to those versed in the art upon making reference to the following detailed description and accompanying drawings in which preferred embodiments incorporating the principles of the present invention are shown by way of illustrative example.

BRIEF DESCRIPTION OF THE DRAWINGS

FIGS. 3A to 3D are graphs, respectively, showing the results of energy spectral analyses upon annealing an SBTO film, which existence or non-existence of Bi diffusion is shown in only a grown film immediately after film growth (FIG. 3A), only a metal underlayer immediately after film growth (FIG. 3B), only the grown film after annealing (FIG. 3C), and only the metal underlayer after annealing (FIG. 3D).

DETAILED DESCRIPTION OF PREFERRED EMBODIMENTS

Figure 1:
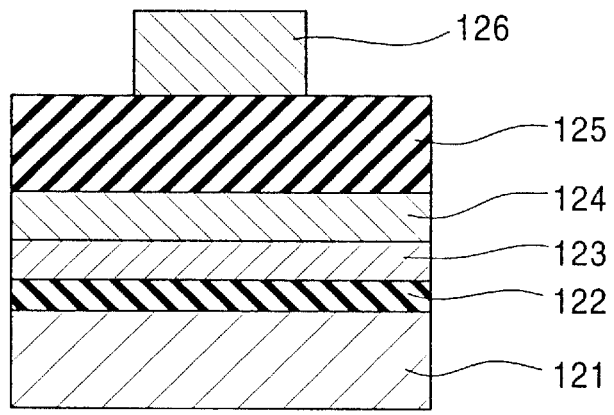
FIG. 1 is a sectional view showing main part of a prior art.
Figure 2:
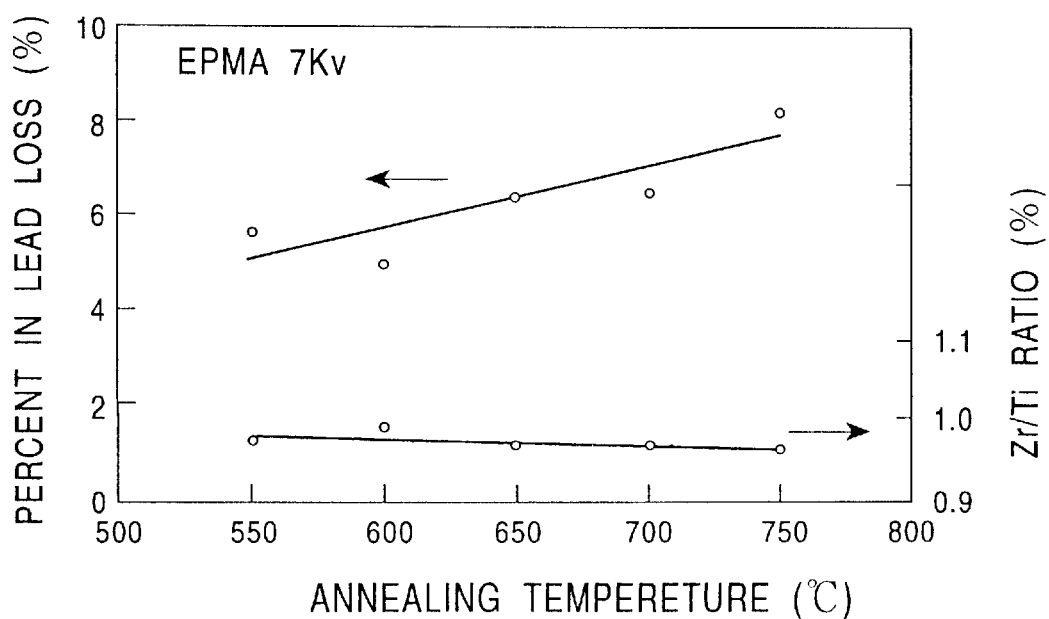
FIG. 2 is a graph for explaining the loss of Pb in annealing a PZT film.

Several preferred embodiments of the present invention will be described below with reference to the accompanying drawings.

The present inventors found that the elements of a dielectric thin film diffused at the interface region with an underlayer in the crystal growth of the dielectric thin film before being entrapped in the underlayer. On the basis of the findings, the amounts of elements to be diffused are increased to change the composition ratio of the dielectric thin film before crystallization, thereby compensating for diffused elements.

More specifically, a thin film formation method according to the embodiments of the present invention is basically a thin film formation method comprising the deposition step of forming a dielectric thin film consisting of many elements, wherein the deposition step is a process of depositing first- and second-layer thin films as upper and lower layers on an underlayer, and crystallizing the thin films to form the dielectric thin film, and the first-layer thin film closer to the underlayer is deposited with a larger composition of at least one kind of constituent element of the thin film than a stoichiometric composition in consideration of diffusion outside the film (including the underlayer).

Crystallization by annealing is performed after depositing the thin films, or crystallization by annealing is performed while depositing the thin films. At least one of the first- and second-layer thin films is formed by sputtering.

Further, according to the present invention, there is provided a thin film formation method comprising a first layer deposition step, a crystallization step, and a second layer deposition step. In the first layer deposition step, raw material particles serving as film formation nuclei are supplied onto an underlayer, and the raw material particles are grown to form the first-layer thin film. In the crystallization step, the first-layer thin film is crystallized by annealing. In the second layer deposition step, the second-layer thin film is formed on the first-layer thin film by using one of raw material particles serving as film formation nuclei and a thin film layer, while heating the underlayer and the crystallized first-layer thin film.

Annealing performed after depositing the first-layer thin film is performed at a temperature set higher than the deposition temperature of the first- or second-layer thin film.

The dielectric thin film may be constituted by an $SrBi_2Ta_2O_9$ film by sputtering. If so, the constituent element in the first-layer thin film having the composition larger than the stoichiometric composition in consideration of diffusion outside the film is Bi.

When the dielectric thin film is constituted by a $SrBi_2Ta_2O_9$ film by sputtering, the first-layer thin film is deposited using a gas mixture of argon and oxygen as a plasma reaction gas, and the second-layer thin film is sputter-deposited using only argon as a plasma reaction gas.

In this case, the second-layer thin film is deposited at a deposition temperature set higher than the deposition temperature of the first-layer thin film.

When the dielectric thin film is constituted by a $SrBi_2Ta_2O_9$ film by sputtering, the first-layer thin film may be deposited using the gas mixture of argon and oxygen as a plasma reaction gas, and the second-layer thin film may be deposited using the gas mixture of argon and oxygen as a plasma reaction gas at a deposition temperature set higher than the deposition temperature of the first-layer thin film.

In the embodiment of the present invention, a capacitor insulating film for a capacitor element formed through an insulating film of, e.g., Si oxide is formed on a semiconductor substrate or an integrated circuit formed on the semiconductor substrate. According to the embodiment of the present invention, the capacitor element is constituted such that first- and second-layer thin films consisting of many elements are deposited to a total thickness of about 300 nm or less on a metal thin film (underlayer) serving as a lower electrode of, e.g, Pt about 50 to 200 nm thick, these films are crystallized by annealing at a temperature of 900° C. or less to form a dielectric thin film, and an upper electrode is formed on the dielectric thin film. In this case, it is important that at least one kind of element of the constitute ent elements of the first-layer thin film before crystallization has a composition larger than the stoichiometric composition (than composition ratios of remaining elements) in consideration of diffusion outside the film (including the underlayer). The thicknesses of the first- and second-layer thin films are preferably determined based on the excessive amount of the element excessively contained in the first-layer thin film. In this manner, flatness can be improved.

It may be possible that the first-layer thin film is crystallized by annealing or the like upon deposition, and the second-layer thin film is deposited on the crystallized first-layer thin film. If the first-layer thin film has a thickness of about 20 nm or less, it may change from a consecutive film to a surface shape having scattered island-like structures upon annealing before depositing the second-layer thin film. In this case, the island-like structures serve as film growth nuclei for depositing the second-layer thin film.

Examples of the dielectric material are perovskite structure crystal films including Pb, other layered crystal oxides including, e.g., PZT and Bi, $SrBi_2Ta_2O_9$, $Bi_4Ti_3O_{12}$, $PbBi_2Ta_2O_9$, and the like. The deposition is preferably performed by sputtering, and the conditions of the reaction gas and the deposition substrate temperature must be properly selected.

As the deposition method, MOCVD (Metal-Organic Chemical Vapor Deposition) using an organic metal raw material can also be employed. However, sputtering is safer and more convenient because it does not use a metal gas (e.g., an organic metal gas) which is toxic to the human body and difficult to handle.

Figure 8:
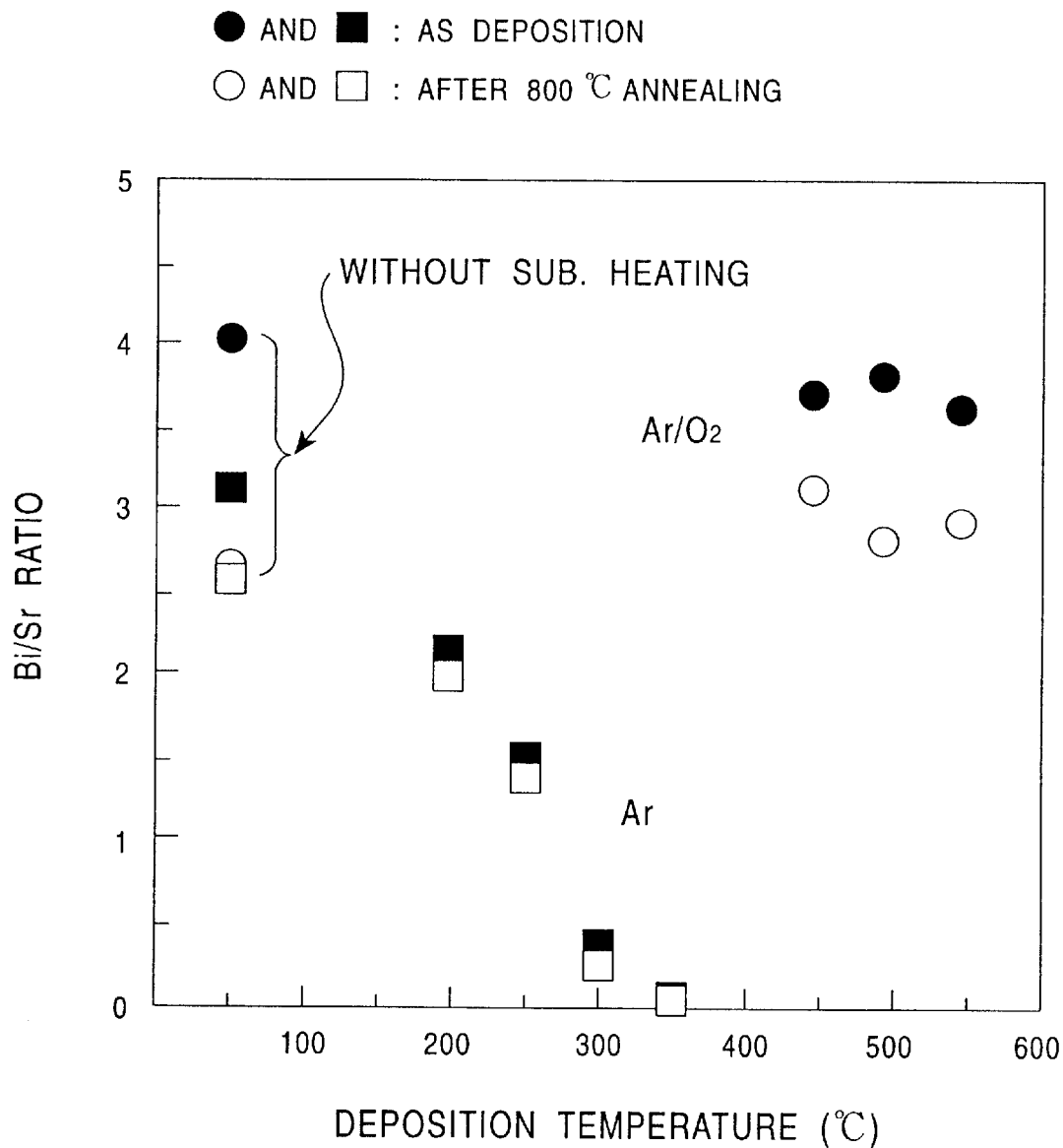
FIG. 8 is a graph showing the composition ratios of Bi to Sr in SBTO films when the films are deposited using Ar and $Ar/O_2$ reaction gases at various substrate temperatures.

Next, the first embodiment of the present invention will be described. FIG. 8 shows the composition ratio of the Bi element to the Sr element constituting an SBTO film serving as a dielectric thin film when the SBTO film serving as the dielectric thin film is deposited on a Pt/Ti film formed on an Si oxide film by sputtering using only Ar gas or an Ar/$O_2$ gas mixture as a reaction gas, while variously changing the substrate heating temperature. The target used for sputtering shown in FIG. 8 is a sintered ceramic target.

In FIG. 8, bullets and hollow bullets represent the results of crystallization by annealing in an oxygen atmosphere at 800° C. during and after film deposition. The Bi/Sr ratio hardly depends on the substrate temperature by using the Ar/$O_2$ gas mixture as a reaction gas. In the deposition method of the present invention, a dielectric thin film having desired dielectric properties can be formed by variously combining the conditions of the sputtering reaction gas used to deposit first- and second-layer thin films for the dielectric thin film, and the substrate temperature in film deposition by sputtering on the basis of the data.

Figure 5A:
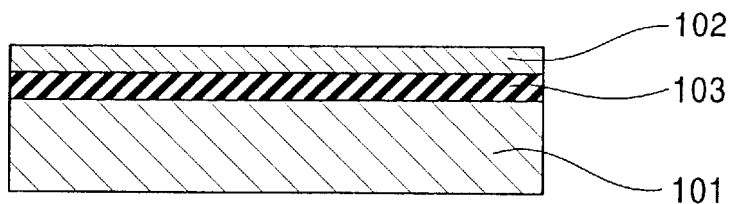
FIGS. 5A to 5D are sectional views, respectively, showing manufacturing steps according to the first embodiment of the present invention.

The embodiment in which a dielectric thin film of the present invention is constituted by SBTO films on the basis of the data shown in FIG. 8 will be described with reference to FIGS. 5A to 5D. As shown in FIG. 5A, a Pt/Ti film 102 is deposited as an underlayer on an Si substrate 101 having an Si oxide film 103 deposited thereon. In this case, of the Pt/Ti film 102, the Pt film has a thickness of 200 nm, and the Ti film has a thickness of 20 nm.

Figure 5B:
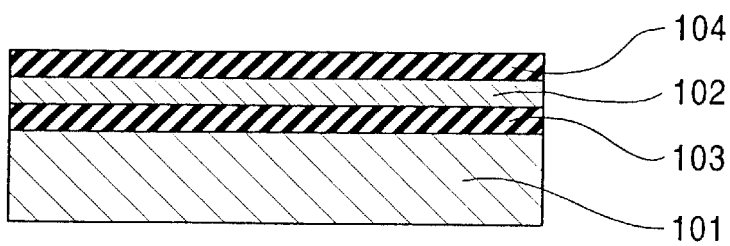
Figure 5C:
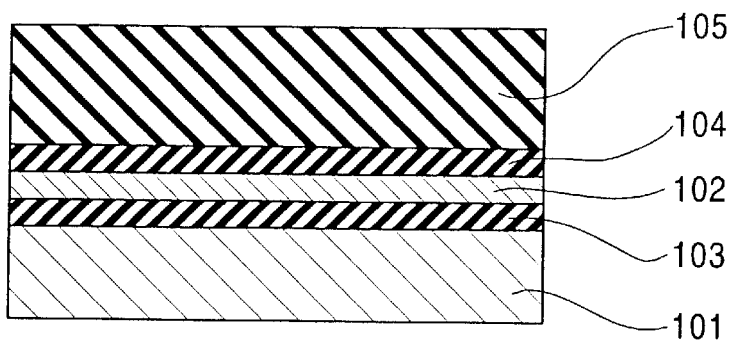
Figure 5D:
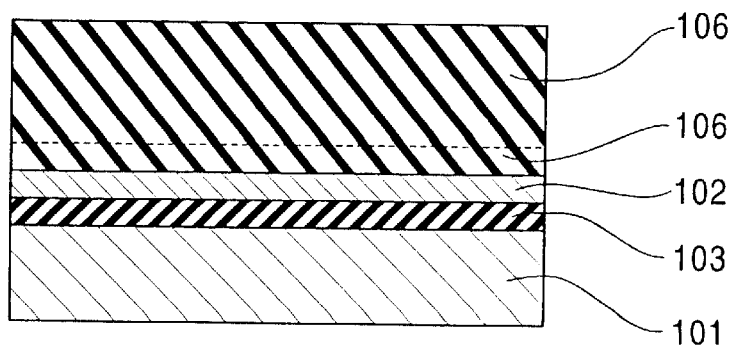

As shown in FIG. 5B, an SBTO film 104 about 20 nm thick is sputter-deposited as a first-layer thin film on the Pt/Ti film 102 at a substrate temperature of 350° C. using an Ar/$O_2$ reaction gas. The target used in this case is a single sintered ceramic target of SBTO (sputtering is not performed for a plurality of targets simultaneously or sequentially), and has the same target composition as the data in FIG. 8.

Then, an SBTO film 105 serving as a second-layer thin film is sputter-deposited on the SBTO film 104 serving as the first-layer thin film. The sputter-deposition is performed using a reaction gas of only Ar at a substrate temperature of 200° C. in thin film deposition in a chamber wherein the SBTO film 104 serving as the first-layer thin film has been sputter-deposited.

The SBTO film 104 serving as the first-layer thin film and the SBTO film 105 serving as the second-layer thin film are crystallized by performing annealing in the oxygen atmosphere at 800° C., thereby integrating them into a dielectric thin film 106. The film deposition temperature at this time is preferably 200° C. or more for a target having the data in FIG. 8. The annealing temperature in the oxygen atmosphere is desirably 600° C. or more. At a lower temperature, annealing must be performed for a longer time.

Identical targets are used for deposition of the SBTO film 104 serving as the first-layer thin film and the SBTO film 105 serving as the second-layer thin film. Sputtering is by radio-frequency (RF) sputtering, and its applied RF power is 1 kW.

According to the above-described embodiment of the present invention, it is believed that crystal nuclei for growing desired crystals in annealing for crystallization are easily produced at the interface region between the dielectric thin film and the underlayer, because there is no degradation of the stoichiometric composition of film constituent elements at the interface region. This is also important for control of the crystal orientation of the formed dielectric thin film (crystalline film) with respect to the underlayer.

Although the above embodiment exemplifies the case using sputtering for film deposition, another method other than sputtering can be employed. It is also effective to crystalize the deposited SBTO film 104 serving as the first-layer thin film and the deposited SBTO film 105 serving as the second-layer thin film by performing annealing at 600° C. or more, thereby integrating them into the dielectric thin film 106.

When the SBTO film 104 serving as the first-layer thin film is deposited using a reaction gas of only Ar, the substrate is not heated, or the deposition temperature is set low, e.g., 200° C. or less with reference to FIG. 8. With this setting, the Bi element contained in the SBTO film 104 in an excessive amount is made to be entrapped in the Pt/Ti film 102 serving as the underlayer. The SBTO film 105 serving as the second-layer thin film is deposited using as a reaction gas only Ar at a relatively high deposition substrate temperature of, e.g., 200° C. with reference to FIG. 8.

When the SBTO film 104 serving as the first-layer thin film and the SBTO film 105 serving as the second-layer thin film are to be deposited by sputtering using an Ar/$O_2$ gas mixture as a reaction gas, it is preferable that the SBTO film 104 serving as the first-layer thin film be deposited at a deposition substrate temperature of about 300° C. (according to FIG. 8, the temperature may be about 500° C. when the substrate is not heated), and then the SBTO film 105 serving as the second-layer thin film be deposited at a higher deposition substrate temperature of 800° C.

In this case, the deposition temperature for the second-layer thin film depends on the target composition. For an Ar/$O_2$ reaction gas, the Bi element in the first-layer thin film in an excessive amount tends to be easily entrapped in the underlayer. For this reason, a decrease in Bi composition of the target is effective. In this case, since crystallization is sufficiently performed in deposition, no annealing is required upon film deposition.

It is also possible that the SBTO film 104 serving as the first-layer thin film is deposited using Ar gas or an Ar/$O_2$ gas mixture as a reaction gas, and crystallized by annealing at 800° C., and then the SBTO film 105 serving as the second-layer thin film is deposited using as a reaction gas only Ar (or an Ar/$O_2$ gas mixture). The SBTO film 105 serving as the second-layer thin film may be deposited at 200° C. with reference to FIG. 8 and crystallized into a ferroelectric thin film by annealing, or deposited at a deposition substrate temperature (e.g., 800° C. or 600° C. or more) sufficient for crystallization. Alternatively, after the substrate is temporarily removed from the deposition chamber, annealing for crystallization can be performed in another chamber or an annealing furnace.

The target for sputter deposition in the above embodiment may be an alloy target of Sr, Bi, and Ta. In use of a metal alloy target, DC voltage can be used as plasma generation energy. Although Ar gas or an Ar/$O_2$ gas mixture is used as a plasma reaction gas, Xe can be used instead of Ar. When a film is deposited using a metal alloy target in a low-temperature atmosphere such as a liquid nitrogen or liquid helium atmosphere, processing of crystallizing the first- and second-layer thin films is effectively performed in oxygen.

Figure 6:
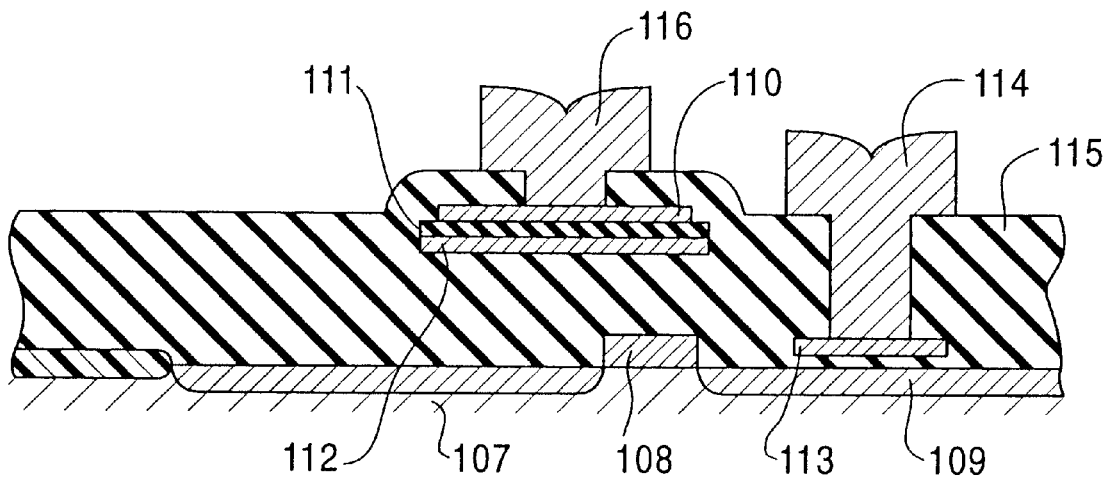
FIG. 6 is a sectional view showing main part of the second embodiment of the present invention.

Next, the second embodiment of the present invention will be described with reference to FIG. 6. FIG. 6 is a sectional view showing a memory element having a ferroelectric capacitor element using a ferroelectric thin film deposited by the deposition method of the first embodiment shown in FIGS. 5A to 5D. A structure shown in FIG. 6 is constituted by a switching transistor, a capacitor element, a selection word line, a bit line, and a plate line. In FIG. 6, reference numeral 107 denotes an Si substrate; 108, a gate electrode (word line); 109, a source/drain diffusion layer; 110, an upper electrode (plate line); 111, a dielectric thin film consisting of an SBTO film; 112, a lower electrode; 113, a bit line (WSi$_2$); 114, an Al interconnection for a bit line; 115, an interlevel insulating film; and 116, an Al interconnection for a plate line.

The capacitor element shown in FIG. 6 is constituted by the SBTO film (dielectric thin film) 111 interposed between the upper electrode 110 and the lower electrode 112. The upper electrode 110 is connected as the plate line to the Al interconnection 116. The dielectric thin film 111 and the lower electrode 112, other than the upper electrode 110, are processed by photolithography using the same mask in the same step. The lower electrode 112 can be used as a plate line. In this case, the dielectric thin film 111 and the upper electrode 110, other than the lower electrode 112, may be processed by photolithography using the same mask in the same step.

Figure 7:
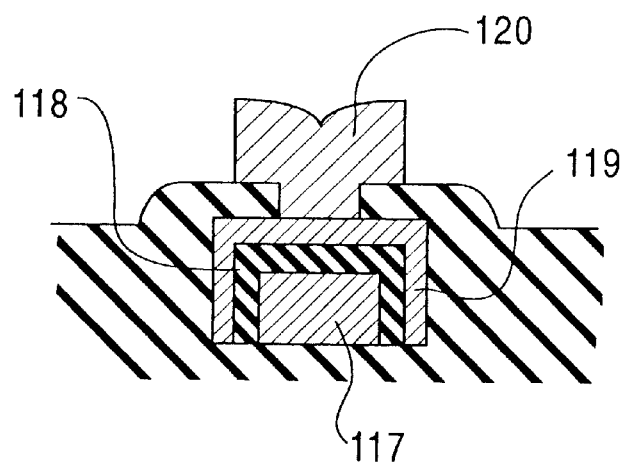
FIG. 7 is a sectional view showing a modification of the second embodiment shown in FIG. 6.

By CVD, or sputter deposition with a high sputtering efficiency of sputter particles on the side surface of a used cylindrical target, a ferroelectric film (dielectric thin film) 118 is deposited on the upper and side surfaces of a lower electrode 117 and used as a capacitor, as shown in FIG. 7.

In a modification shown in FIG. 7, a ferroelectric film 118 consisting of SBTO is deposited by MOCVD on the 500-nm lower electrode 117 processed into a block shape, e.g., a Pt film. The material of the lower electrode 117 may be a conductive metal oxide such as Ru oxide. An upper Pt electrode 119 is deposited to 100 nm on the ferroelectric film 118, and processed using a mask. An interlevel insulating film is deposited, a contact hole is formed, and an Al interconnection 120 for a plate line is arranged.

Figure 4:
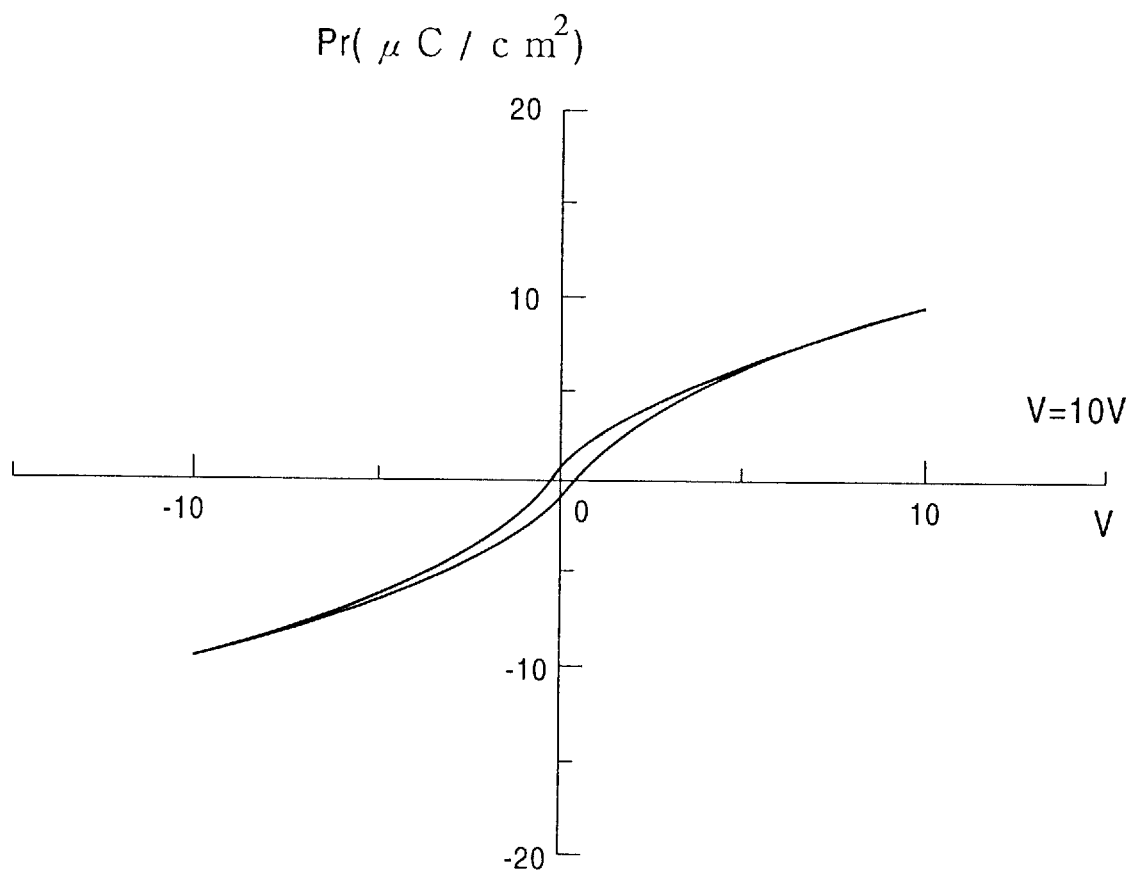
FIG. 4 is a graph showing polarization characteristics obtained when an SBTO film is deposited by a conventional sputtering deposition technique to form a capacitor element.
Figure 9:
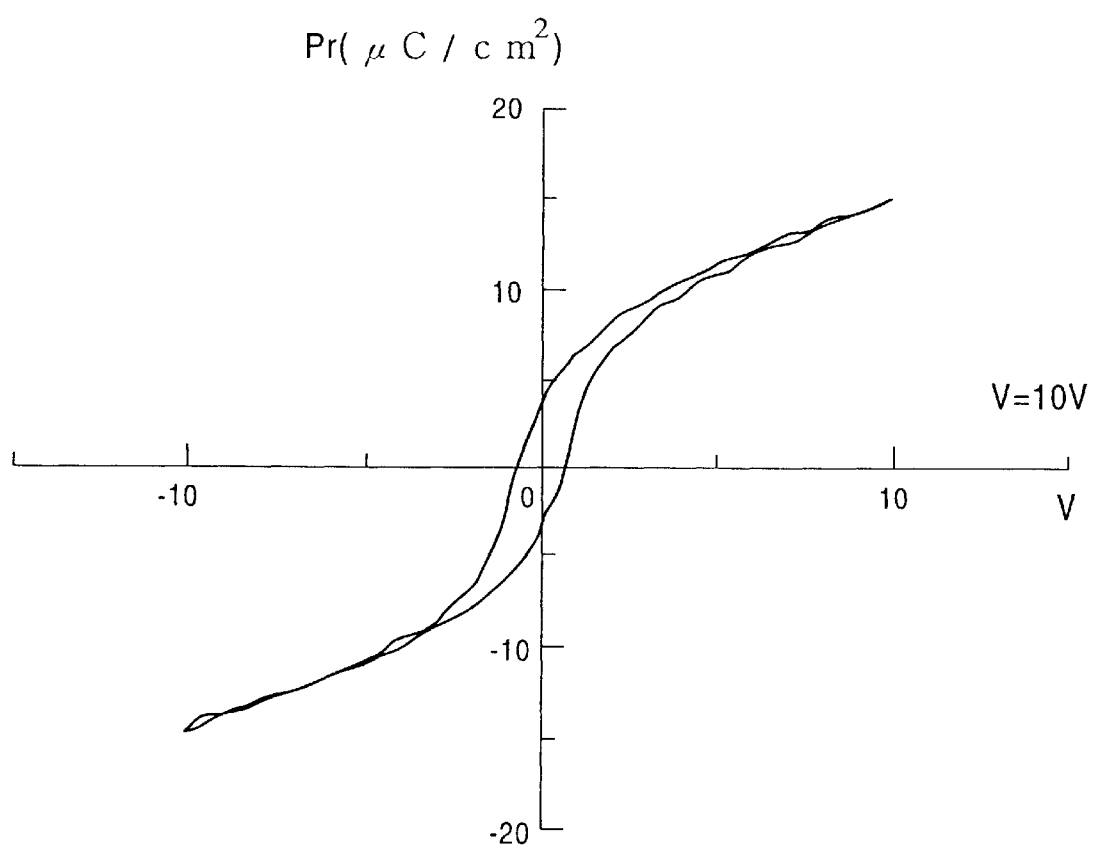
FIG. 9 is a graph showing polarization characteristics obtained when an SBTO film is deposited by the method of the first embodiment of the present invention to form a capacitor element.

FIG. 9 is a graph showing polarization characteristics obtained when a dielectric thin film consisting of SBTO is deposited using the method of the first embodiment and used as a capacitor element. It is apparent from FIG. 9 that the polarization values are larger than the characteristic values in the prior art shown in FIG. 4, and the characteristics are improved.

Since the capacitor film is sputter-deposited, the undulating surface reflecting the corrugation shape of the lower layer can be formed after depositing the interlevel insulating film without performing polishing or the like before forming the capacitor element so as to planarize the entire surface of the substrate in the memory element as the semiconductor memory device shown in the second embodiment.

In the modification of the second embodiment in FIG. 7, since the ferroelectric thin film is formed on the side surface of the lower electrode by CVD, a larger amount of electric charge can be accumulated on the same substrate area, and a larger number of memory cells can be arranged on the same area.

What we claimed is:

1. In a thin film formation method wherein a dielectric thin film consisting of many elements is formed by depositing first- and second-layer thin films as lower and upper layers on an underlayer, and crystallizing at least one of said thin films to form said dielectric thin film, the improvement wherein said first-layer thin film closer to said under layer is deposited as composition having at least one constituent element of said thin film in stoichiometric excess amount, and said second-layer thin film is formed on said first-layer thin film, in stoichiometric composition ratio.

2. In a method according to claim 1, the improvement further comprising performing said crystallization by annealing after depositing said first-layer thin film.

3. In a method according to claim 1, the improvement further comprising performing said crystallization by annealing after depositing said second-layer thin film.

4. In a method according to claim 1, the improvement further comprising performing said crystallization by annealing during depositing said first-layer thin film.

5. In a method according to claim 1, the improvement further comprising performing said crystallization by annealing during depositing said second-layer thin film.

6. In a method according to claim 1, the improvement wherein at least one of said first- and second-layer thin films is formed by sputtering.

7. In a thin film formation method comprising a first layer thin film deposition step, a first-layer thin film crystallization step, and a second-layer thin film deposition step, wherein the first-layer thin film deposition step comprises supplying raw material particles serving as film formation nuclei onto an underlayer, and growing said raw material particles to form said first-layer thin film, and said crystallization step comprises crystallizing said first-layer thin film by annealing, the improvement wherein a constituent element of the raw material particles supplied in the first-layer thin film deposition step is supplied in stoichiometric excess amount, and the second-layer thin film deposition step comprises forming said second-layer thin film on said first-layer thin film by using particles of said raw material supplied in stoichiometric excess in the first-layer thin film deposition step as film formation nuclei, while heating said underlayer and said crystallized first-layer thin film.

8. In a method according to claim 7, the improvement wherein said annealing in the crystallization step performed after depositing said first-layer thin film is performed at a temperature which is higher than the film deposition temperature of said first- or second-layer thin film.

9. In a method according to claim 7, the improvement wherein said dielectric thin film is constituted by an SrBi$_2$Ta$_2$O$_9$ film, and said constituent element in said first-layer thin film in stoichiometric excess is Bi.

10. In a method according to claim 7, the improvement wherein said first-layer thin film is deposited using a gas mixture of argon and oxygen as a plasma reaction gas, and said second-layer thin film is sputter-deposited using only argon as a plasma reaction gas.

11. In a method according to claim 7, the improvement wherein said second-layer thin film is deposited at a deposition temperature which is higher than the deposition temperature of said first layer thin film.

12. In a method according to claim 7, the improvement wherein said first-layer thin film is deposited using a gas mixture of argon and oxygen as a plasma reaction gas, and said second-layer thin film is deposited using the gas mixture of argon and oxygen as a plasma reaction gas at a deposition temperature which is higher than the deposition temperature of said first-layer thin film.

13. In a method according to claim 7, the improvement wherein said first-layer thin film is deposited using a gas mixture of argon and oxygen as a plasma reaction gas, and said second-layer thin film is sputter-deposited using only argon as a plasma reaction gas.

14. In a method according to claim 7, the improvement wherein said second-layer thin film is deposited at a deposition temperature which is higher than the deposition temperature of said first-layer thin film.

15. In a method according to claim 7, the improvement wherein said first-layer thin film is deposited using a gas mixture of argon and oxygen as a plasma reaction gas, and said second layer thin film is deposited using the gas mixture of argon and oxygen as a plasma reaction gas at a deposition temperature which is higher than the deposition temperature of said first-layer thin film.

* * * * *